United States Patent
Imai et al.

(10) Patent No.: US 8,164,330 B2
(45) Date of Patent: *Apr. 24, 2012

(54) MAGNETIC SENSOR AND MAGNETIC FIELD STRENGTH MEASUREMENT METHOD SATURATING MAGNETIZATION OF MAGNETIZATION-FREE LAYER

(75) Inventors: Takakazu Imai, Tokyo (JP); Kei Tanabe, Tokyo (JP)

(73) Assignee: TDK Corporation, Tokyo (JP)

( * ) Notice: Subject to any disclaimer, the term of this patent is extended or adjusted under 35 U.S.C. 154(b) by 451 days.

This patent is subject to a terminal disclaimer.

(21) Appl. No.: 12/369,978

(22) Filed: Feb. 12, 2009

(65) Prior Publication Data

US 2009/0206833 A1    Aug. 20, 2009

(30) Foreign Application Priority Data

Feb. 15, 2008   (JP) ................. P2008-035072

(51) Int. Cl.
*G01R 33/02* (2006.01)
(52) U.S. Cl. ....................................... 324/252
(58) Field of Classification Search .............. 324/252
See application file for complete search history.

(56) References Cited

U.S. PATENT DOCUMENTS

| | | | |
|---|---|---|---|
| 4,596,950 A | 6/1986 | Lienhard et al. | |
| 5,831,426 A | 11/1998 | Black, Jr. et al. | |
| 6,028,730 A | 2/2000 | Ishihara | |
| 6,252,390 B1 | 6/2001 | Black, Jr. et al. | |
| 6,447,935 B1 * | 9/2002 | Zhang et al. | 428/810 |
| 6,656,604 B2 * | 12/2003 | Hasewaga | 428/611 |
| 6,717,403 B2 | 4/2004 | Witcraft et al. | |
| 2006/0002031 A1 * | 1/2006 | Shoji | 360/313 |
| 2009/0309588 A1 * | 12/2009 | Nieuwenhuis et al. | 324/232 |

FOREIGN PATENT DOCUMENTS

| | | |
|---|---|---|
| JP | A-10-208216 | 8/1998 |
| JP | A-2005-502888 | 1/2005 |
| JP | A-2005-515667 | 5/2005 |
| JP | A-2006-19383 | 1/2006 |
| JP | A-2006-66821 | 3/2006 |
| JP | A-2006-134388 | 5/2006 |
| JP | A-2006-267120 | 10/2006 |
| JP | B2-3835354 | 10/2006 |
| JP | B2-3835447 | 10/2006 |
| WO | WO 03/023431 A1 | 3/2003 |

OTHER PUBLICATIONS

English Translation of Jan. 19, 2010 Office Action issued in Japanese Patent Application No. P2008-035072.
Translation of Japanese Office Action dated Jun. 22, 2010 issued in Japanese Patent Application No. 2008035072.

* cited by examiner

*Primary Examiner* — Jay Patidar
(74) *Attorney, Agent, or Firm* — Oliff & Berridge, PLC

(57) ABSTRACT

The magnetic sensor according to the present invention includes: a magneto-resistive effect element which has a stacked body in which a magnetization-free layer, a nonmagnetic layer, and a magnetization fixed layer are stacked in this order, and the longitudinal direction of which is a direction perpendicular to the stacking direction; and a current path layer which is provided on the magneto-resistive effect element via an insulation layer so as to be spaced apart from the magneto-resistive effect element in the stacking direction, and which generates a magnetic field by being supplied with a current. The current path layer extends in a direction which forms an angle between 0 and 45 degrees to the longitudinal direction of the magneto-resistive effect element when viewed from the stacking direction.

2 Claims, 9 Drawing Sheets

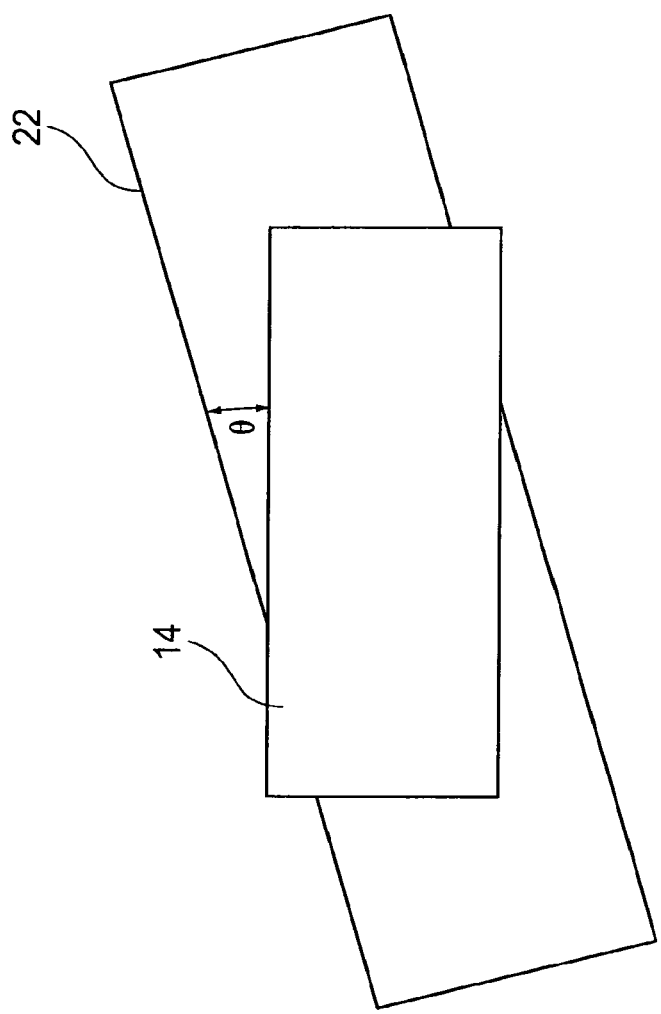
Fig. 9
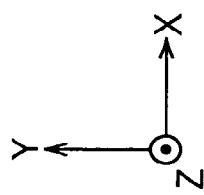

MAGNETIC SENSOR AND MAGNETIC FIELD STRENGTH MEASUREMENT METHOD SATURATING MAGNETIZATION OF MAGNETIZATION-FREE LAYER

BACKGROUND OF THE INVENTION

1. Field of the Invention

The present invention relates to a magnetic sensor and a method of measuring magnetic field strength.

2. Related Background Art

Magnetic sensors which employ a magneto-resistive effect element such as a GMR (Giant Magneto-Resistive) element are known. These magnetic sensors utilize a phenomenon whereby the resistance value of the magneto-resistive effect element depends on the relative angle between the magnetization orientations of a magnetization-free layer and a magnetization fixed layer respectively in the magneto-resistive effect element. More specifically, while a fixed sensing current is flowing in the magneto-resistive effect element, an external magnetic field which is to be measured is applied to the magnetization-free layer in the magnetic sensor in order to change the magnetization direction thereof and measurement of the external magnetic field is performed by measuring the resistance value of the magneto-resistive effect element.

In cases where an external magnetic field is applied to the magnetization-free layer, hysteresis exists for the relationship between the degree of magnetization and the external magnetic field. Hence, hysteresis also exists for the relationship between the resistance value of the magneto-resistive effective element and the external magnetic field. That is, even when an external magnetic field of the same strength is applied, the resistance value and the gain of the magneto-resistive effect element (the gradient of the resistance value/external magnetic field strength cure of the magneto-resistive effect element) sometimes changes depending on the strength of another external magnetic field applied to the magnetization-free layer just before the external magnetic field is applied. When this arises, an error is generated when the external magnetic field is measured using the magnetic sensor.

In order to prevent such a problem, a method for applying a magnetic field to the magnetization-free layer to saturate the magnetization either before measuring the external magnetic field, at regular intervals, or every time a fixed number of measurements have been carried out is known. When this application of a magnetic field is stopped after saturating the magnetization in this manner, the magnetized state of the magnetization-free layer is fixed irrespective of the state before the magnetization is saturated (referred to hereinbelow as the 'initialization of the magnetization-free layer').

Initialization of this kind is performed by providing a solenoid coil or a spiral-shaped coil, for example, close to the magneto-resistive effect element. More specifically, the solenoid coil or spiral-shaped coil is placed close to the magneto-resistive effect element in the longitudinal direction of the magneto-resistive effect element and the magnetic fields generated by these coils are applied in the longitudinal direction of the magneto-resistive effect element (See Japanese Patent Document Nos. 3835447 and 3835354, and Japanese Patent Application Laid Open Nos. 2006-267120 and 2005-515667.

SUMMARY OF THE INVENTION

The aforementioned prior art employs a solenoid coil or spiral-shaped coil in order to apply a magnetic field for initializing the magnetization-free layer. Hence, because the structure of a magnetic sensor is complex, the overall shape of tie magnetic sensor is large and the fabrication costs are also high.

The present invention was conceived in view of this problem and an object of the present invention is to provide a magnetic sensor whose structure is simpler than that of the prior art, whose overall shape can be miniaturized, and for which the manufacturing costs are low, and a method of measuring magnetic field strength which employs such a magnetic sensor.

In order to solve the above problems, a magnetic sensor according to the present invention comprises: a magneto-resistive effect element which has a stacked body in which a magnetization-free layer, a nonmagnetic layer, and a magnetization fixed layer are stacked in this order, and the longitudinal direction of which is a direction perpendicular to the stacking direction; and a current path portion which is provided on the magneto-resistive effect element via an insulation layer so as to be spaced apart from the magneto-resistive effect element in the stacking direction, and which generates a magnetic field by being supplied with a current. The current path portion extends in a direction which forms an angle between 0 and 45 degrees to the longitudinal direction of the magneto-resistive effect element when viewed from the stacking direction.

In order to solve the above problems, another magnetic sensor according to the present invention comprises: a magneto-resistive effect element which has a stacked body in which a magnetization-free layer, a nonmagnetic layer, and a magnetization fixed layer are stacked in this order, and the longitudinal direction of which is a direction perpendicular to the stacking direction; and a current path portion which is provided on the magneto-resistive effect element via an insulation layer so as to be spaced apart from the magneto-resistive effect element in the stacking direction, and which generates a magnetic field by being supplied with a current. The current path portion extends parallel to the longitudinal direction of the magneto-resistive effect element when viewed from the stacking direction.

With the magnetic sensor of the present invention, the magnetization of the magnetization-free layer is oriented in the longitudinal direction of the magneto-resistive effect element due to shape anisotropy under no magnetic field. Furthermore, when an external magnetic field is applied to the magnetization-free layer in a direction perpendicular to the longitudinal direction of the magneto-resistive effect element, the relative angle between the magnetization directions of the magnetization-free layer and the magnetization fixed layer respectively changes depending on the strength of the external magnetic field. Hence, measuring the resistance value of the magneto-resistive effect element makes it possible to measure the strength of the external magnetic field applied.

In addition, by applying a magnetic field generated by a current path portion to the magnetization-free layer to saturate the magnetization before measuring the external magnetic field strength, the magnetization of the magnetization-free layer can be initialized. The current path portion used in this initialization is a member which extends in a direction forming an angle between 0 and 45 degrees to the longitudinal direction of the magneto-resistive effect element when viewed from the stacking direction. That is, the magnetic field applied by the current path portion to the magnetization-free layer has a larger component in a direction perpendicular to the longitudinal direction than its component in the longitudinal direction of the magneto-resistive effect element.

Hence, the magnetization-free layer can be initialized by the current path portion in a direction intersecting the longitudinal direction of the magneto-resistive effect element. Furthermore, the current path portion does not have a conventional coil shape but rather is a member which extends in a direction forming a predetermined angle to the longitudinal direction of the magneto-resistive effect element. Hence, a magnetic sensor whose structure is simpler than that of the prior art, whose overall shape can be miniaturized, and for which the manufacturing costs are low is obtained.

In addition, in cases where the current path portion is disposed perpendicularly to the magneto-resistive effect element when viewed from the stacking direction as per the prior art, a plurality of current path portions must be arranged in a spiral shape, for example, when viewed from the stacking direction, in order to apply the desired magnetic field to each part of the magneto-resistive effect element. In contrast, because the present invention allows the magnetic field which is generated by the current path portion to be applied to the magnetization-free layer more efficiently than in the prior art, there may be a single current path portion and power consumption while the magnetic sensor is operating can be reduced over that of the prior art.

The current path portion also preferably extends parallel to the longitudinal direction of the magneto-resistive effect element. Consequently, the magnetic field generated by the current path portion is such that the component in the longitudinal direction of the magneto-resistive effect element substantially disappears in the magnetization-free layer and the component in a direction perpendicular to the longitudinal direction of the magneto-resistive effect element increases to an equal extent. Hence, the value of the current flowing in the current path portion for initializing the magnetization of the magnetization-free layer can be made small and a magnetic sensor with reduced power consumption is obtained.

Moreover, the current path portion is preferably provided in plurality on the magnetization-free layer side or on the magnetization fixed layer side, thereby strengthening the magnetic field applied by the current path portion to the magnetization-free layer. A magnetic sensor capable of reliably initializing magnetization of the magnetization-free layer is therefore obtained.

Furthermore, the current path portion is preferably provided on both the magnetization-free layer side and the magnetization fixed layer side, thereby strengthening the magnetic field applied by the current path portion to the magnetization-free layer. A magnetic sensor capable of reliably initializing magnetization of the magnetization-free layer is therefore obtained.

Further, an insulation layer provided between the magneto-resistive effect element and the current path portion is preferably a stacked film of a plurality of insulation layers. Since standards can be satisfied using an insulator of 0.4 mm or less when employing thin sheet material prescribed by product safety standards such as UL60950-1(2.10.5.2), for example, a low profile can be achieved.

A method of measuring magnetic field strength according to the present invention comprises a magnetization saturation step of supplying a current to the current path portion of the above magnetic sensor, applying a magnetic field generated by the current path portion to the magnetization-free layer, and saturating the magnetization of the magnetization-free layer in a direction in which the magnetic field is applied; and a measurement step of measuring the magnetic field strength of an external magnetic field which is applied to the magnetization-free layer after the magnetization saturation step.

The magnetic field strength measurement method of the present invention is capable of measuring external magnetic field strength by using a magnetic sensor whose structure is simpler than that of the prior art, whose overall shape can be miniaturized, and for which the manufacturing costs are low. That is, with the magnetic sensor used by the present invention, the magnetization of the magnetization-free layer is oriented in the longitudinal direction of the magneto-resistive effect element under no magnetic field. Further, if an external magnetic field is applied to the magnetization-free layer in a direction perpendicular to the longitudinal direction of the magneto-resistive effect element, the relative angle between the magnetization directions of the magnetization-free layer and the magnetization fixed layer respectively changes depending on the strength of the external magnetic field. Hence, measuring the resistance value of the magneto-resistive effect element makes it possible to measure the strength of the external magnetic field.

In addition, by applying the magnetic field generated by the current path portion to the magnetization-free layer to saturate the magnetization direction thereof before measuring the external magnetic field strength, the magnetization of the magnetization-free layer can be initialized. The current path portion used in this initialization is a member which extends in a direction forming an angle between 0 and 45 degrees to the longitudinal direction of the magneto-resistive effect element when viewed from the stacking direction. That is, the magnetic field applied by the current path portion to the magnetization-free layer has a larger component in a direction perpendicular to the longitudinal direction than its component in the longitudinal direction of the magneto-resistive effect element. Hence, the magnetization-free layer can be initialized by the current path portion in a direction which is perpendicular to the longitudinal direction of the magneto-resistive effect element Furthermore, the current path portion does not have a conventional coil shape but rather is a member which extends in a direction forming a predetermined angle to the longitudinal direction of the magneto-resistive effect element. Hence, the strength of the external magnetic field can be measured by using a magnetic sensor whose structure is simpler than that of the prior art, whose overall shape can be miniaturized and for which the manufacturing costs are low.

In addition, in cases where the current path portion is disposed perpendicularly when viewed from the stacking direction to the magneto-resistive effect element as per the prior art, a plurality of current path portions must be arranged when viewed from the stacking direction in order to apply the desired magnetic field to each part of the magneto-resistive effect element. In contrast because the present invention allows the magnetic field generated by the current path portion to be applied to the magnetization-free layer more efficiently than the prior art, there may be a single current path portion and the power consumption during operation of the magnetic sensor can be reduced over that of the prior art.

In addition, an external magnetic field which has the same direction as the direction in which the magnetization of the magnetization-free layer is saturated in the magnetization saturation step is preferably applied to the magnetization-free layer in the measurement step. Consequently, when the external magnetic field is measured, an external magnetic field with an opposite orientation from that of the magnetic field applied to initialize the magnetization-free layer is not applied to the magnetization-free layer. As a result, the hysteresis of the resistance value/external magnetic field of the magneto-resistive effect element is extremely small, thereby permitting more accurate measurement of the external magnetic field strength.

The present invention provides a magnetic sensor whose structure is simpler than that of the prior art whose overall shape can be miniaturized, and for which the manufacturing costs are low, and a method of measuring magnetic field strength which employs such a magnetic sensor.

BRIEF DESCRIPTION OF THE DRAWINGS

FIG. 9 is a schematic view of a modified example of this embodiment.

DESCRIPTION OF THE PREFERRED EMBODIMENTS

Figure 1:
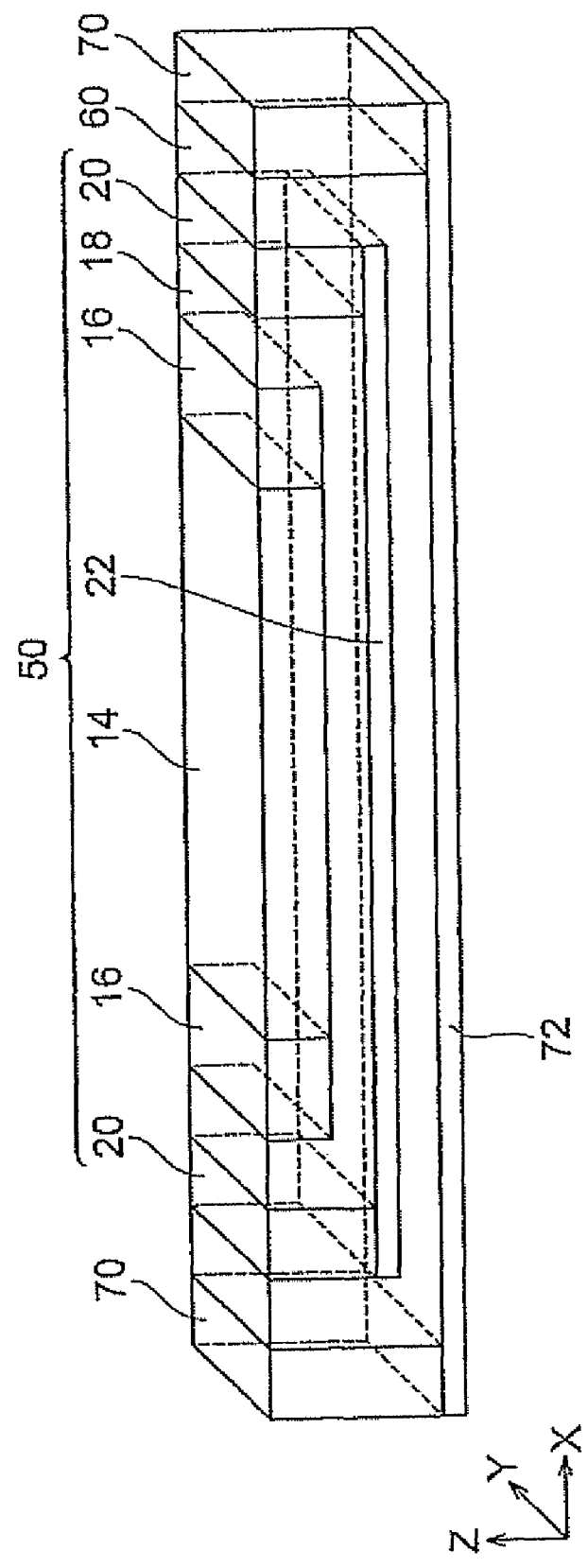
FIG. 1 is a view showing a schematic structure of a magnetic sensor according to this embodiment.

A magnetic sensor according to an embodiment and a method of measuring magnetic field strength which uses such a magnetic sensor will be described in detail hereinbelow with reference to the attached drawings. The same reference numerals are used for the same elements in each of the drawings and repetitive description is avoided. Furthermore, the dimensional ratios within and between the constituent elements in the drawings are arbitrary, having been selected to make the drawings clear.

FIG. 1 is a view showing the schematic structure of the magnetic sensor according to this embodiment. As shown in FIG. 1, a magnetic sensor 50 mainly comprises a magneto-resistive effect element 14 and a current path layer 22 which constitutes a current path portion.

The magneto-resistive effect element 14 comprising a plurality of layers which are stacked in a direction along the Z axis as will be described hereinbelow (that is, the stacking direction of the magneto-resistive effect element 14 is a direction moving in a positive direction along the Z axis or a negative direction along the Z axis). The magneto-resistive effect element 14 has a longitudinal direction along the X axis which is one of the directions perpendicular to the stacking direction. Furthermore, a pair of electrode layers 16 constituted by a conductive material such as Cu, Au, Ti, or Al which is a nonmagnetic metal are provided at the two ends in the longitudinal direction of the magneto-resistive effect element 14. By applying a voltage across the pair of electrode layers 16, a sensing current is supplied to the magneto-resistive effect element 14.

The thickness of the magneto-resistive effect element 14 is not particularly restricted and can be 20 to 100 nm, for example nor are there any particular restrictions on the length in the longitudinal direction of the magneto-resistive effect element 14 or in a direction perpendicular to the longitudinal direction (along the Y axis), which can be 50 to 300 μm and 2 to 20 μm respectively, for example. Furthermore, when the length in the longitudinal direction of the magneto-resistive effect element 14 is X and the length in a direction perpendicular to the longitudinal direction (direction along the Y axis) is Y, X/Y, which is a value obtained by dividing X by Y, can be 25 to 150, for example.

A current path layer 22 is provided on the magneto-resistive effect element 14 via an insulation layer 18 which is constituted by an insulating material such as a ceramic insulator such as AlOx or a polymer insulator such as SiOx or polyimide, for example, so as to be separated in the stacking direction from the magneto-resistive effect element 14. The insulation layer 18 is preferably a stacked film of a plurality of insulation layers.

There are no particular restrictions on the current path layer 22, which may be constituted by a conductive material such as Cu, Au, Ti, or Al, which are nonmagnetic metals and can be formed by a vacuum thin film formation process such as sputtering or vapor deposition or by a wet process such as plating, for example. The longitudinal direction of the current path layer 22 follows the X axis as does the magneto-resistive effect element 14. A pair of electrode layers 20 constituted by the same conductive material as the electrode layers 16 are provided at the two ends of the current path layer 22 in the longitudinal direction. A current is supplied to the current path layer 22 by applying a voltage across the pair of electrode layers 20. The thickness of the current path layer 22 can be 0.1 to 20 μm, for example. The length of the current path layer 22 is preferably greater than the overall length of the magneto-resistive effect element 14 so that the magnetic field generated by the current path layer 22 (described in detail subsequently) is applied mostly uniformly to the whole magneto-resistive effect element 14 in a direction along the X axis. Thus, if the magnetic field applied to the whole of the magneto-resistive effect element 14 is mostly uniform, the initialization of the magnetization of the magnetization-free layer (described subsequently) can be performed in a stable manner. Furthermore, the width of the current path layer 22 (its length in a direction along the Y axis) is also preferably greater than the overall width of the magneto-resistive effect element 14 (its length in a direction along the Y axis) for the same reasons.

Furthermore, a current signal layer 72 for generating a magnetic field which is to be measured is provided on the magnetic sensor 50 via an insulation layer 60. That is, the magnetic sensor 50 and the current signal layer 72 which is to be measured are integrated. The current signal layer 72 is constituted by a conductive material and its longitudinal direction follows the X axis as does the current path layer 22. A pair of electrode layers 70 constituted by the same conductive material as the electrode layers 16 are provided at the two ends of the current signal layer 72 in the longitudinal direction. A current is supplied to the current signal layer 72 by applying a voltage across the pair of electrode layers 70 and the magnetic field generated by the current signal layer 72 is measured by the magnetic sensor 50.

Figure 2:
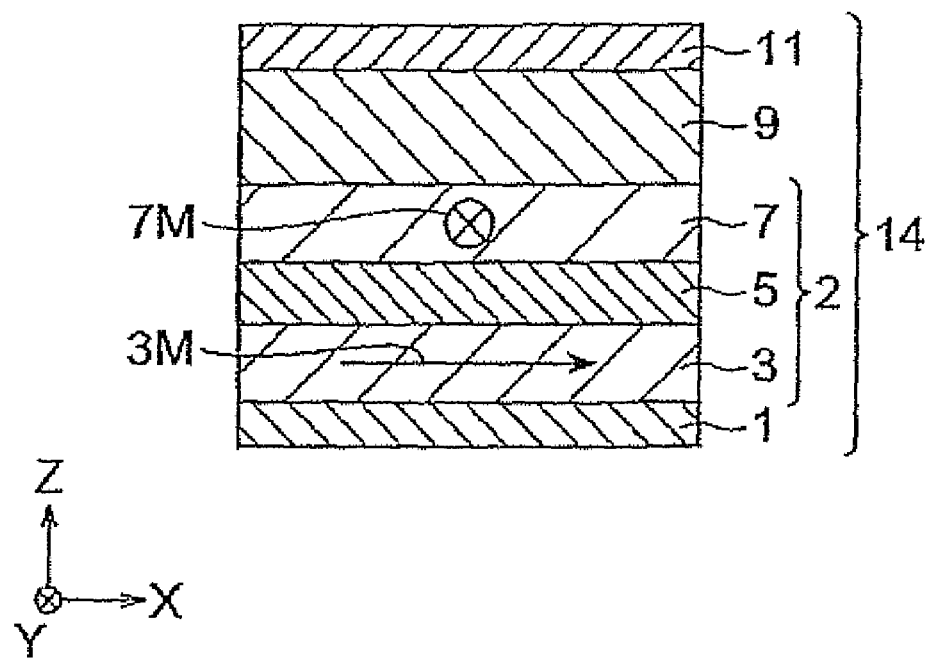
FIG. 2 is a detailed cross-sectional view of a magneto-resistive effect element.

FIG. 2 is a detailed cross-sectional view of the magneto-resistive effect element. As shown in FIG. 2, the magneto-resistive effect element 14 has a stacked body 2 obtained by stacking the magnetization-free layer 3, a nonmagnetic layer 5, and a magnetization fixed layer 7 in this order. Furthermore, the stacked body 2 is stacked on a substrate layer 1, and an antiferromagnetic layer 9 and a cap layer 11 are stacked on the stacked body 2 in this order.

The magnetization-free layer 3 is constituted by a ferromagnetic material and is constituted by a two-layer film of CoFe on the order of 1 nm thick and NiFe on the order of 3 to 4 nm thick, or the like, for example. The magnetization direction 3M of the magnetization-free layer 3 is not fixed by an exchange coupling unlike a magnetization direction 7M of the magnetization fixed layer 7 (described subsequently). Hence, when an external magnetic field is applied, the magnetization direction 3M of the magnetization-free layer 3 rotates in the application direction of the external magnetic field. In addition, in cases where the external magnetic field is not applied, the magnetization direction 3M of the magnetization-free layer 3 is weakly fixed in tie X axis direction which is the longitudinal direction of the magneto-resistive effect element 14 by the shape anisotropy of the magnetization-free layer 3.

The nonmagnetic layer 5 is constituted by a nonmagnetic conductive metal such as Cu on the order of 1 to 3 nm thick.

The magnetization fixed layer 7 is constituted by a ferromagnetic substance of CoFe on the order of 1 to 5 nm thick. An antiferromagnetic layer 9 constituted by an antiferromagnetic substance consisting of IrMn, PtMn, NiMn, and RuRhMn or the like on the order of 5 to 15 nm thick is stacked on the magnetization fixed layer 7. The antiferromagnetic layer 9 and the magnetization fixed layer 7 are exchange-coupled and the magnetization direction 7M of the magnetization fixed layer 7 is substantially fixed in the positive direction of the Y axis. The magnetization fixed layer 7 may have a three-layer structure in which a nonmagnetic intermediate layer of Ru or the like is sandwiched between a pair of ferromagnetic layers of CoFe or the like. In this case, if the film thickness of the nonmagnetic intermediate layer is suitably selected, the magnetization of the pair of ferromagnetic layers sandwiching the nonmagnetic intermediate layer is exchange-coupled in antiparallel and the magnetization fixed layer 7 has a so-called synthetic ferri-pinned structure. In this case, the magnetization direction of the magnetization fixed layer 7 is more strongly fixed.

The underlayer 1 is formed by a material such as Ta and is provided with the objective of improving the crystallinity of each layer stacked on the underlayer 1 of the magneto-resistive effect element 14. The cap layer 11 is formed by a material such as Ta and is provided with the objective of protecting each layer of the magneto-resistive effect element 14. The magneto-resistive effect element 14 may not comprise the underlayer 1 and/or the cap layer 11.

Applying a voltage across the pair of electrode layers 16 (See FIG. 1) causes a sensing current to flow in the magneto-resistive effect element 14 parallel to the film surface thereof. That is, the magneto-resistive effect element 14 is a current-in-plane (CIP) GMR (Giant Magneto-Resistive) element.

A method of measuring the external magnetic field strength which uses the magnetic sensor according to this embodiment will be described next using FIGS. 3 to 5.

Figure 3:
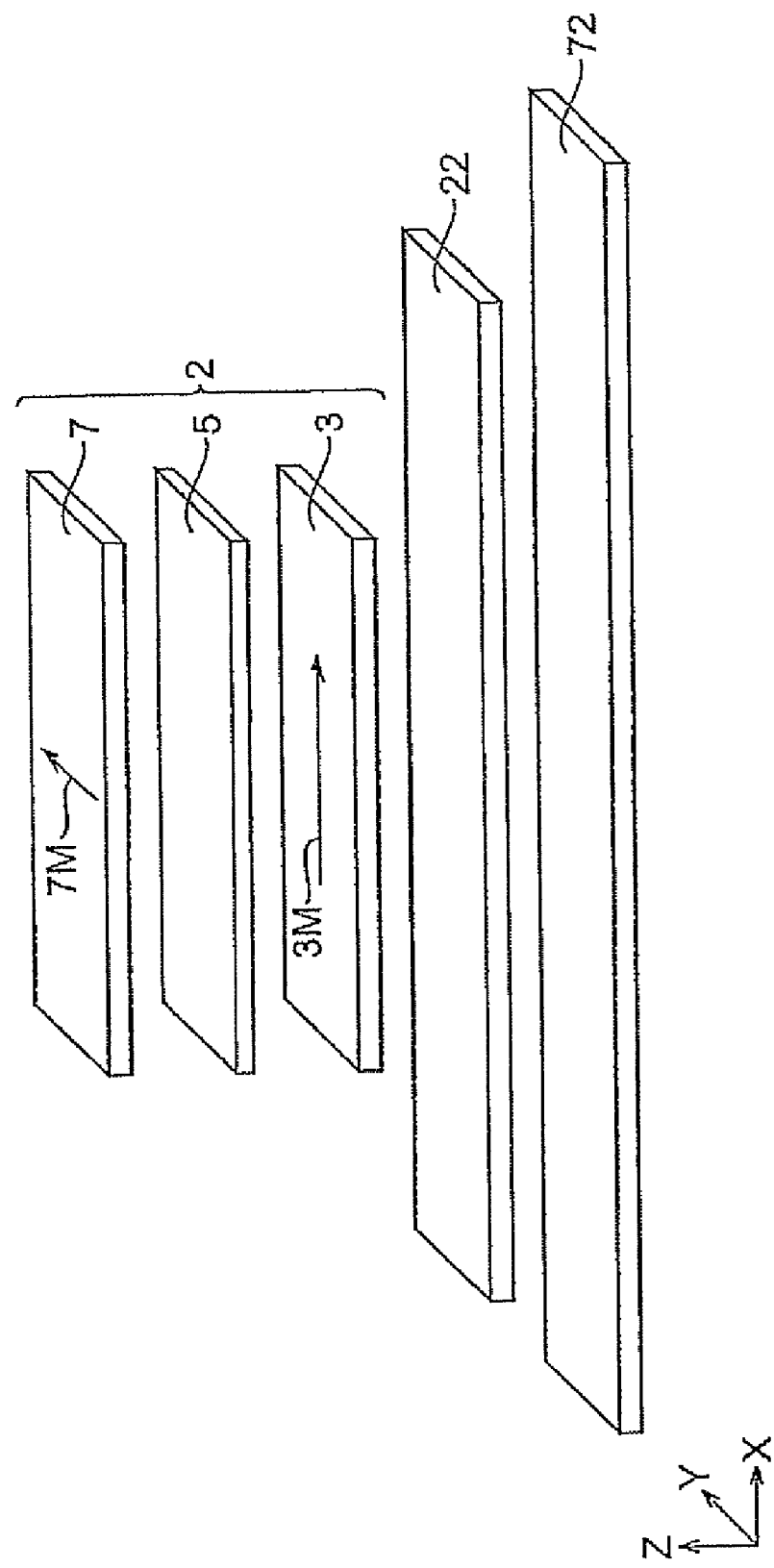
FIG. 3 is a schematic view of the positional relationships between a stacked body, a current path layer, and a current signal layer which the magneto-resistive effect element comprises.

FIG. 3 is a schematic view of the positional relationships between the stacked body 2, the current path layer 22, and the current signal layer 72 which the magneto-resistive effect element 14 (See FIG. 2) comprises. The magnetization-free layer 3, the nonmagnetic layer 5, and the magnetization fixed layer 7 constituting the stacked body 2 are originally stacked in that order (See FIG. 2) and FIG. 3 (and FIGS. 7 and 8 below) expediently shows each of these layers separately. As shown in FIG. 3, the magnetization direction 7M of the magnetization fixed layer 7 is fixed in a direction perpendicular to the longitudinal direction of the magnetization fixed layer 7 (a direction along the Y axis) and, in a case where an external magnetic field is not applied in the magnetization direction 3M of the magnetization-free layer 3, the magnetization direction 7M is oriented in the longitudinal direction of the magnetization-free layer 3 (a direction along the X axis).

When the external magnetic field is measured, prior to measurement of the external magnetic field, a current is supplied to the current path layer 22 and the magnetic field generated by the current path layer 22 is applied to the magnetization-free layer 3. This aspect will now be described using FIG. 4. FIG. 4 shows the magnetization-free layer 3 from the stacking direction and shows the relationship between the magnetization-free layer 3 and the current path layer 22.

Figure 4:
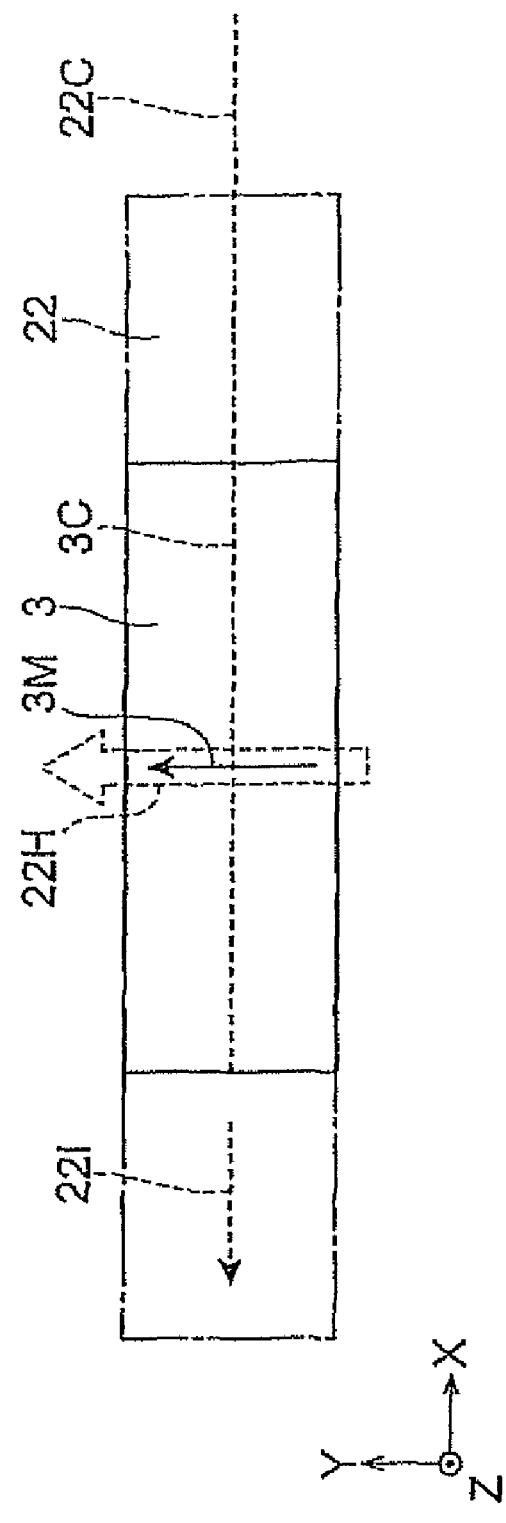
FIG. 4 is a view showing a magnetization-free layer 3 when viewed from the stacking direction.
Figure 5:
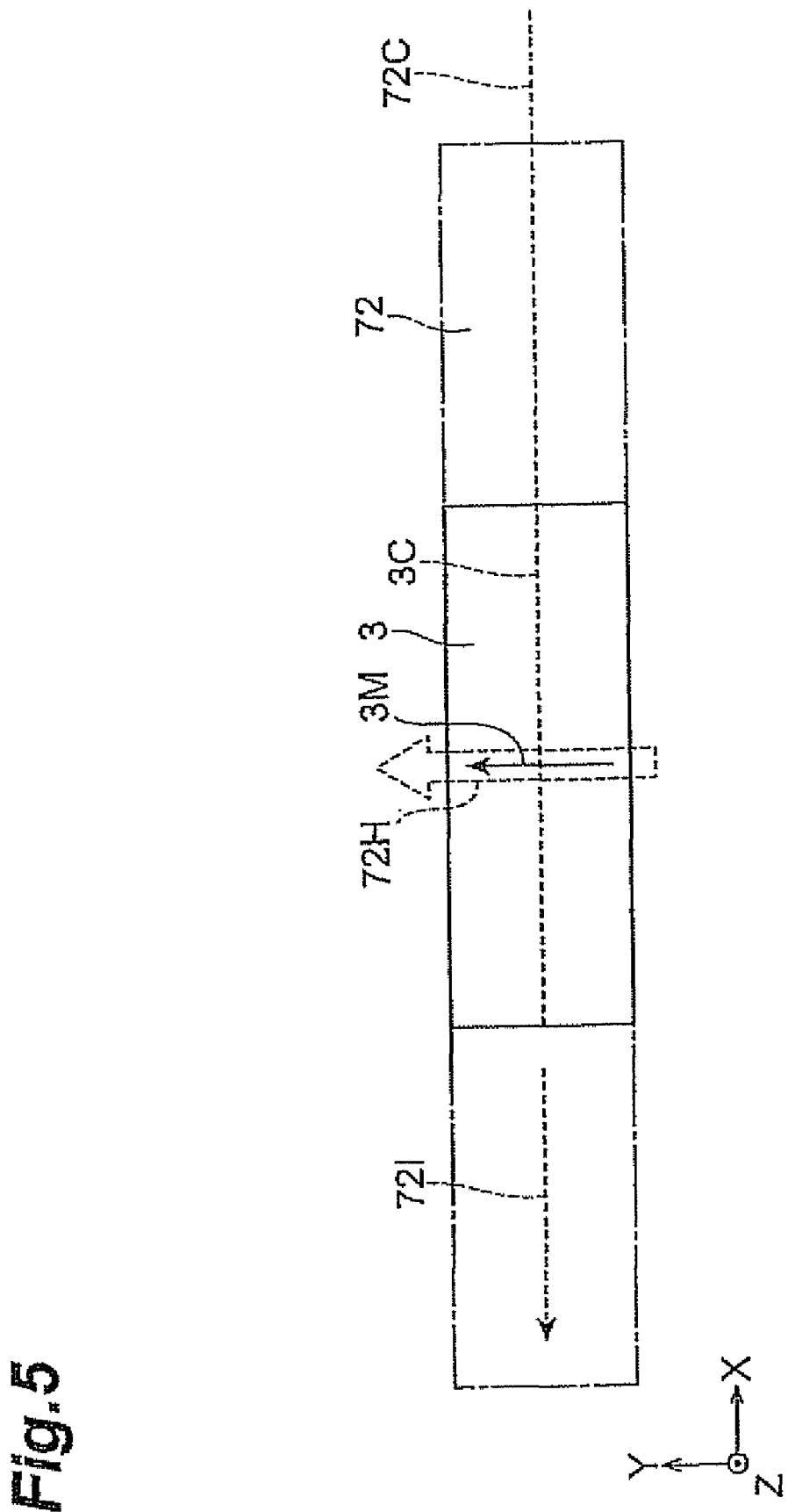
FIG. 5 is a view showing the magnetization-free layer 3 when viewed from the stacking direction.

As shown in FIG. 4, in order to apply a magnetic field to the magnetization-free layer 3, a voltage is applied across the pair of electrode layers 20 (See FIG. 1) and a current 22I flows in the longitudinal direction of the current path layer 22. The magnetization-free layer 3 and the current path layer 22 are separate in the stacking direction of the magneto-resistive effect element 14 (See FIGS. 1 and 2) and an axis 3C which runs in the longitudinal direction of the magnetization-free layer 3 and an axis 22C which runs in the longitudinal direction of the current path layer 22 are parallel to each other when viewed from the stacking direction (that is, the angle formed by the axis 3C and the axis 22C is 0 degrees). The magnetic field 22H generated by the current path layer 22 is therefore applied to the magnetization-free layer 3 in a direction perpendicular to the longitudinal direction of the magnetization-free layer 3. Here, the strength of the magnetic field 22H is adjusted to saturate the magnetization of the magnetization-free layer 3. Thereafter the flow of the current 22I in the current path layer 22 is stopped and the application of the magnetic field 22H to the magnetization-free layer 3 is stopped.

The external magnetic field is subsequently measured. The principles behind this measurement will now be illustrated using FIG. 5. FIG. 5 shows the magnetization-free layer 3 from the stacking direction and shows the relationship between the magnetization-free layer 3 and the current signal layer 72 which generates the magnetic field which is to be measured.

A current 72I is made to flow in the current signal layer 72 by applying a voltage across the pair of electrode layers 70 (See FIG. 1). A magnetic field 72H which is to be measured is then generated and the magnetic field 72H is applied to the magnetization-free layer 3. Here, the magnetization-free layer 3 and the current signal layer 72 are separated in the stacking direction of the magneto-resistive effect element 14 (See FIGS. 1 and 2) and the axis 3C which runs in the longitudinal direction of the magnetization-free layer 3 and an axis 72C which runs in the longitudinal direction of the current signal layer 72 are parallel to each other when viewed from the stacking direction (that is, the angle formed by the axis 3C and the axis 72C is 0 degrees). The magnetic field 72H generated by the current signal layer 72 is therefore applied to the magnetization-free layer 3 in a direction perpendicular to the longitudinal direction of the magnetization-free layer 3.

Because the magnetization direction 3M of the magnetization-free layer 3 changes as a result of the application of the magnetic field 72H, the relative angle between the magnetization direction 3M of the magnetization-free layer 3 and the magnetization direction 7M of the magnetization fixed layer 7 (See FIG. 3) varies. For example, in cases where the magnetic field 72H is very high and the magnetization of the magnetization-free layer 3 is saturated, the magnetization direction 3M of the magnetization-free layer 3 is perpendicular to the longitudinal direction of the magnetization-free layer 3 as shown in FIG. 5. Further, as a result of the magneto-resistive effect, the resistance value of the magneto-resistive effect element 14 changes with dependence on the relative angle between the magnetization direction 3M and the magnetization direction 7M. The amount of variation in the magnetization direction 3M depends on the strength of the magnetic field 72H. Hence, if a voltage is applied across the pair of electrode layers 16 (See FIG. 1) and a magnetic field 72H is applied to the magnetization-free layer 3 while a fixed sensing current is flowing in the magneto-resistive effect element 14, for example, the voltage across the pair of electrode layers 16 changes depending on the strength of the magnetic field 72H. Hence, if the voltage across the pair of electrode layers 16 is measured, the strength of the magnetic field 72H can be measured.

Figure 6:
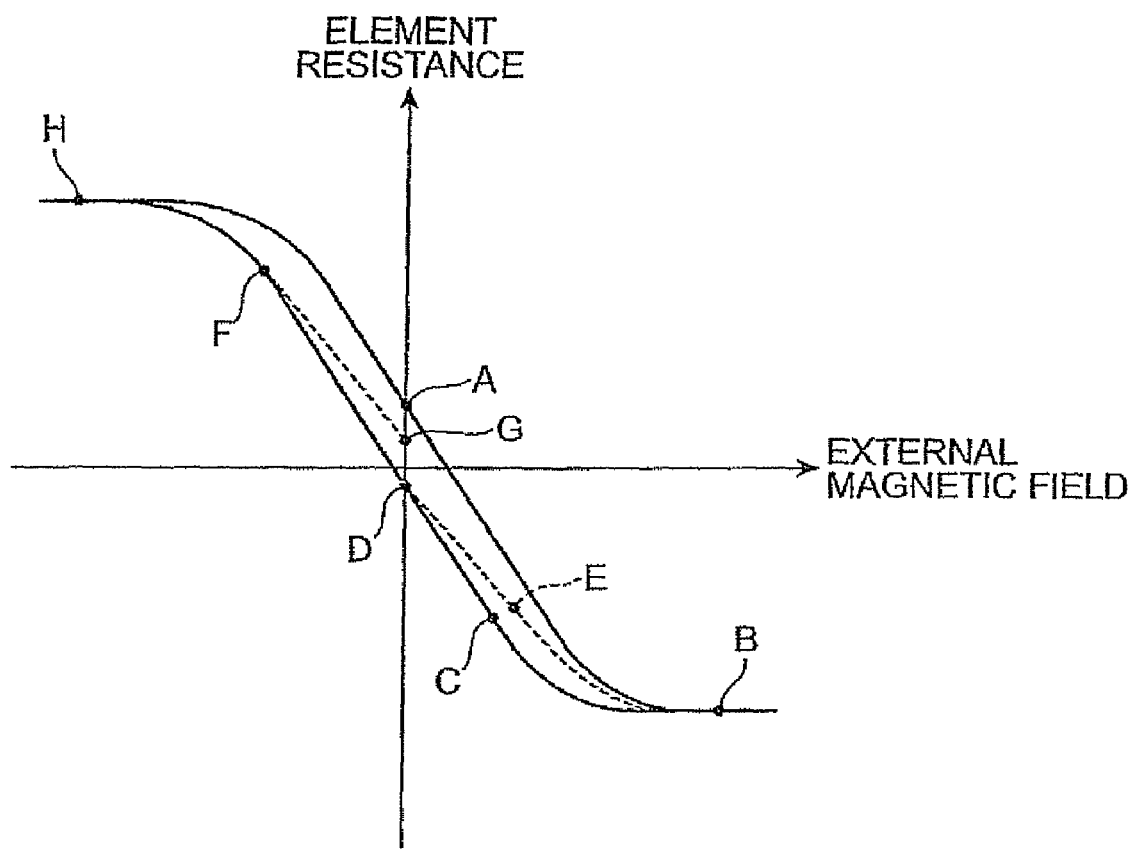
FIG. 6 is a view showing the relationship between the magneto-resistive effect element and the external magnetic field.

The effect of applying the magnetic field 22H to the magnetization-free layer 3 before measuring the external magnetic field will be described next using FIG. 6. FIG. 6 shows the relationship between the magneto-resistive effect element and the external magnetic field. In FIG. 6, the vertical axis represents the resistance value of the magneto-resistive effect element 14 and the horizontal axis represents the strength of the external magnetic field applied to the magnetization-free layer 3, where the application of the external magnetic field in the Y axis direction is shown as a positive direction.

As shown in FIG. 6, because the relative angle between the magnetization direction 3M of the magnetization-free layer 3 and the magnetization direction 7M of the magnetization fixed layer 7 changes when the external magnetic field is applied to the magnetization-free layer 3, the resistance value of the magneto-resistive effect element 14 changes. Because the relationship between the magneto-resistive effect element 14 and the external magnetic field exhibits hysteresis as shown in FIG. 6, the relationship between the external magnetic field and the magneto-resistive effect element 14 is not necessarily limited to one-to-one correspondence. The existence of hysteresis causes errors in the measurement of the external magnetic field.

However, with the method for measuring the external magnetic field strength by means of the magnetic sensor 50 according to this embodiment as outlined above, the magnetic field 22H is applied so that the magnetization of the magnetization-free layer 3 is saturated prior to applying the external magnetic field 72H which is to be measured to the magnetization-free layer 3 (See FIG. 4). Hence, the resistance value of the magneto-resistive effect element 14 assumes a value D after reaching a value B in FIG. 6. Thereafter, when the magnetic field 72H which is to be measured (See FIG. 5) is applied, the resistance value of the magneto-resistive effect element 14 changes so as to pass along the path D-E-B. That is, the magnetization of the magnetization-free layer 3 is initialized by applying the magnetic field 22H so that the magnetization of the magnetization-free layer 3 is saturated. As a result, there is one-to-one correspondence between the strength of the magnetic field 72H and the value of the magneto-resistive effect element 14 and therefore the strength of the magnetic field 72H can be accurately measured.

In cases where a plurality of external magnetic fields are measured, this initialization of the magnetization of the magnetization-free layer 3 may be performed again before measuring the external magnetic fields or may be performed before subsequent measurement after measuring the external magnetic fields a fixed number of times. The magnetization can also be initialized after a fixed time has elapsed.

Furthermore, in the measurement of the external magnetic field, the magnetic field 72H which is to be measured is preferably applied in the same direction as the magnetic field 22H which is applied to the magnetization-free layer 3 to initialize the magnetization of the magnetization-free layer 3.

As a result, in measurement of the magnetic field 72H after initializing the magnetization of the magnetization-free layer 3, the resistance value of the magneto-resistive effect element 14 changes sequentially to D, E, B, C, and then D in FIG. 6, for example, and therefore hysteresis is small. Hence, even when the magnetic field strength is measured a plurality of times after initializing the magnetization of the magnetization-free layer 3 once, the strength of the magnetic field 72H can be measured accurately. For example, when the magnetic field 72H which is to be measured is applied in the opposite direction from the magnetic field 22H applied to the magnetization-free layer 3 after initializing the magnetization of the magnetization-free layer 3, the resistance value of the magneto-resistive effect element 14 after the application of a magnetic field is ended is a value G when the strength of the magnetic field 72H is the value F and the resistance value of the magneto-resistive effect element 14 after the application of the magnetic field is ended is value A when the strength of the magnetic field 72H is value H.

Hence, in cases where the external magnetic field strength in a positive direction in FIG. 6 is subsequently measured without initializing the magnetization of the magnetization-free layer 3, hysteresis is larger in comparison with a case where only the strength of the external magnetic field in the positive direction in FIG. 6 is measured. Also when the external magnetic field in the opposite direction from the magnetic field 22H which is applied to the magnetization-free layer 3 to initialize the magnetization of the magnetization-free layer 3 is measured, if the initialization of the magnetization of the magnetization-free layer 3 is performed before the external magnetic field strength is measured on every occasion, the strength of the magnetic field 72H can be accurately measured.

Furthermore, the current path layer 22 in the magnetic sensor 50 according to this embodiment is a member which, rather than having a conventional coil shape, extends in tie longitudinal direction of the magneto-resistive effect element 14 (See FIGS. 3 and 4). Hence, the magnetic sensor 50 obtained has a simpler structure than that of the prior art, has an overall shape which can be miniaturized, and lower manufacturing costs. Furthermore, the current path layer 22 extends in the longitudinal direction of the magneto-resistive effect element 14 and therefore, in comparison with a conventional case where a magnetic field generated by a coil is applied, the magnetic field 22H generated by the current path layer 22 can be efficiently applied to the magnetization-free layer 3. Hence, the power consumption while the magnetic sensor 50 is operating can also be reduced beyond that of the prior art.

In addition, the current path layer 22 extends parallel to the longitudinal direction of the magneto-resistive effect element 14 and therefore the magnetic field 22H generated by the current path layer 22 has substantially no component in the magnetization-free layer 3 in the longitudinal direction of the magneto-resistive effect element 14 and an increased component in the magnetization-free layer 3 in a direction perpendicular to the longitudinal direction of the magneto-resistive effect element 14. Hence, the current value flowing in the current path layer 22 in order to initialize the magnetization of the magnetization-free layer 3 can be made small and the magnetic sensor 50 which is obtained therefore has reduced power consumption.

Furthermore, the insulating layer 18 provided between the magneto-resistive effect element 14 and the current path layer 22 in the magnetic sensor 50 according to this embodiment is preferably constituted by a stacked film of a plurality of insulation layers (see FIG. 1). Here, since standards can be satisfied using an insulator of 0.4 mm or less in cases where thin sheet material prescribed by product safety standards such as UL60950-1(2.10.5.2), for example, is employed, a thin shape can be achieved.

The magnetic sensor 50 according to this embodiment measures the magnetic field 72H generated by the current signal layer 72. If information on the relative positional relationship between the magnetic sensor 50 and the current signal layer 72 is already known in addition to the strength of the magnetic field 72H, the current 72I flowing in the current signal layer 72 can be measured. That is, the magnetic sensor 50 according to this embodiment can also be used as a current sensor.

The present invention is not limited to the above embodiment and various modifications are possible.

Figure 7:
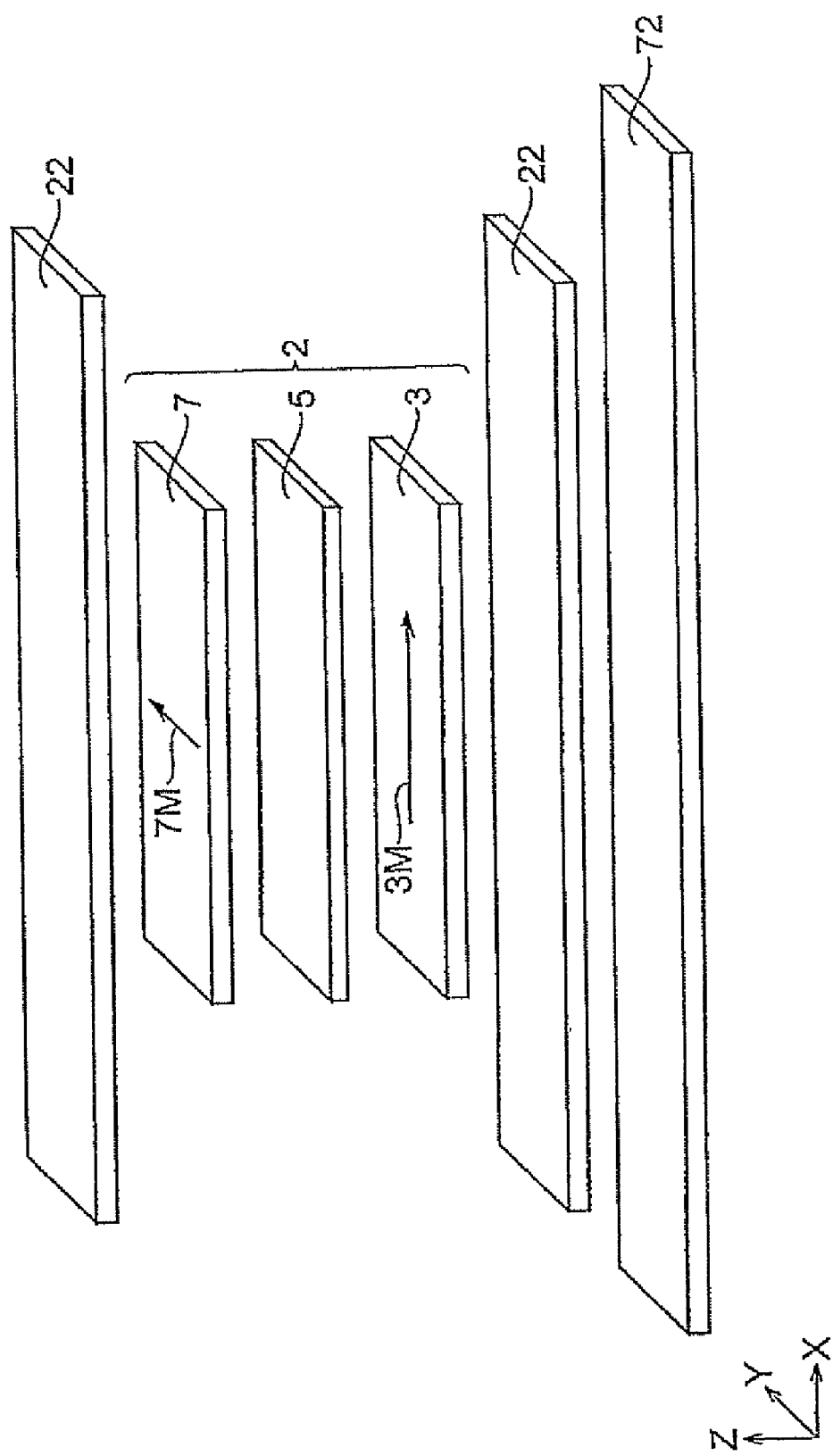
FIG. 7 is a schematic view of a modified example of this embodiment.

For example, as shown in FIG. 7, the current path layer 22 may be provided on both the magnetization-free layer 3 side and the magnetization fixed layer 7 side, which results in an increase in the strength of the magnetic field applied to the magnetization-free layer 3 by the current path layer 22. The magnetic sensor 50 thus obtained is capable of reliably initializing the magnetization of the magnetization-free layer 3.

Figure 8:
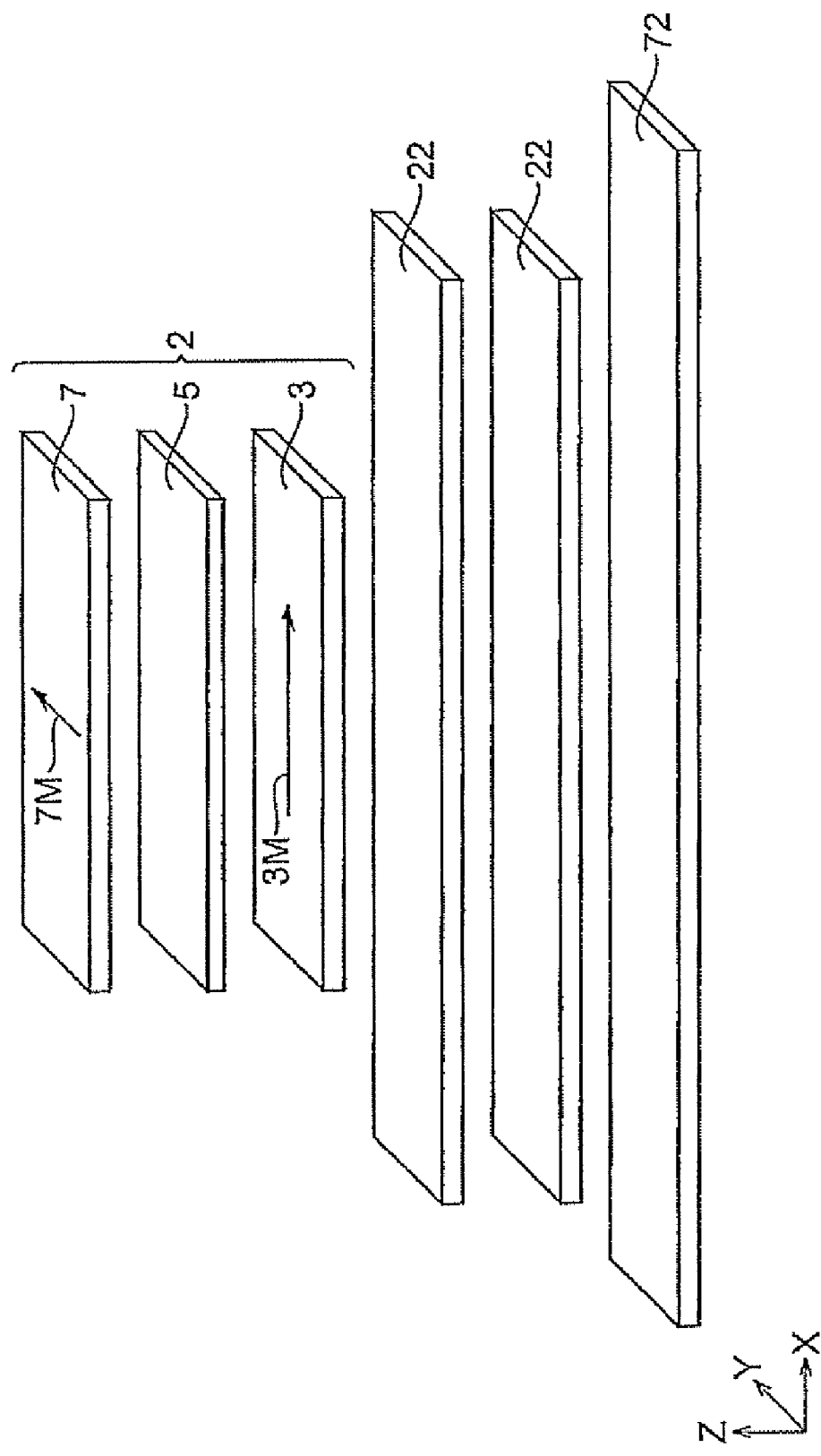
FIG. 8 is a schematic view of a modified example of this embodiment.

Furthermore, as shown in FIG. 8, the current path layer 22 may be provided in plurality on the side of the magnetization-free layer 3, thereby strengthening of the magnetic field applied to the magnetization-free layer 3 by the current path layer 22. The magnetic sensor 50 thus obtained is capable of reliably initializing the magnetization of the magnetization-free layer 3. In this case, there may be two current path layers 22 as shown in FIG. 8 or three or more current path layers 22. The current path layer 22 may also be provided in plurality on the side of the magnetization fixed layer 7. In FIG. 8, a single current path layer 22 or a plurality of current path layers 22 may also be provided on the side of the magnetization fixed layer 7.

Moreover, in the above embodiment, the current path layer 22 extends parallel to the longitudinal direction of the magneto-resistive effect element 14 from the stacking direction (See FIGS. 1 and 4) or may not be parallel. Here, the current path layer 22 may extend in a direction which forms an angle θ between 0 and 45 degrees to the longitudinal direction of the magneto-resistive effect element 14 when viewed from the stacking direction, as shown in FIG. 9. Consequently, the magnetic field applied by the current path layer 22 to the magnetization-free layer 3 has a larger component in a direction perpendicular to the longitudinal direction than its component in the longitudinal direction of the magneto-resistive effect element 14. The magnetization-free layer 3 can therefore be initialized by the current path layer 22 in a direction intersecting the longitudinal direction of the magneto-resistive effect element 14.

Furthermore, although the current path layer 22 which is the current path portion is a layer-shaped member formed by a vacuum thin film formation process such as sputtering or vapor deposition or by a wet process such as plating, for example, in the above embodiment, the current path portion may also be a linear member of copper wire or the like.

In addition, the magneto-resistive effect element 14 is a CIP-type GMR element in the above embodiment but may also be a CPP (Current Perpendicular in Plane)-type GMR element or a TMR (Tunnel Magneto-Resistive) element. In the case of a CPP-type GMR element, a pair of electrode layers 16 (See FIG. 1) are electrically connected to the two end faces of the magneto-resistive effect element 14 in the stacking direction. With the TMR element, additionally the nonmagnetic layer 5 (See FIG. 2) is constituted by a nonmagnetic insulating material such as $Al_2O_3$ or MgO on the order of 1 to 2 nm thick instead of a nonmagnetic metal such as Cu.

In addition, the magnetization direction 7M of the magnetization fixed layer 7 may be fixed in a direction other than a direction perpendicular to the longitudinal direction of the magnetization fixed layer 7 (See FIGS. 2 and 3).

In addition, according to this embodiment, the magnetic sensor 50 is physically integrated with the current signal layer 72 for generating the magnetic field 72H which is to be measured (See FIG. 1) but the magnetic sensor 50 and the current signal layer 72 may also be physically separate from each other.

Moreover, although the magnetic field generated by the current is measured by the magnetic sensor 50 in this embodiment, the magnetic sensor 50 may also be used in a distance measurement application or another application for sensing the distance from a permanent magnet by the strength of the magnetic field, for example.

What is claimed is:

1. A method of measuring magnetic field strength, comprising:

supplying a current to a current path portion of a magnetic sensor including a magneto-resistive effect element which has a stacked body in which a magnetization-free layer, a nonmagnetic layer, and a magnetization fixed layer are stacked in this order, and the longitudinal direction of which is a direction perpendicular to the stacking direction, the current path portion being provided on the magneto-resistive effect element via an insulation layer so as to be spaced apart from the magneto-resistive effect element in the stacking direction, and the current path portion generating a magnetic field by being supplied with the current;

applying a magnetic field generated by the current path portion to the magnetization-free layer;

saturating the magnetization of the magnetization-free layer by the current path portion in a direction in which the magnetic field is applied, the current path portion extending in a direction which forms an angle between 0 and 45 degrees to the longitudinal direction of the magneto-resistive effect element when viewed from the stacking direction, the current path portion having a straight shape; and measuring the magnetic field strength of an external magnetic field which is applied to the magnetization-free layer after the saturation, an external magnetic field being applied to the magnetization-free layer, the external magnetic field being oriented in the same direction as the direction in which the magnetization of the magnetization-free layer is saturated in the saturation.

2. A method of measuring magnetic field strength, comprising:

supplying a current to a current path portion of a magnetic sensor including a magneto-resistive effect element which has a stacked body in which a magnetization-free layer, a nonmagnetic layer, and a magnetization fixed layer are stacked in this order, and the longitudinal direction of which is a direction perpendicular to the stacking direction and the current path portion which is provided on the magneto-resistive effect element via an insulation layer so as to be spaced apart from the magneto-resistive effect element in the stacking direction, and the current path portion generating a magnetic field by being supplied with the current;

applying a magnetic field generated by the current path portion to the magnetization-free layer;

saturating the magnetization of the magnetization-free layer by the current path portion in a direction in which the magnetic field is applied, the current path portion extending parallel to the longitudinal direction of the magneto-resistive effect element when viewed from the stacking direction, the current path portion having a straight shape; and measuring the magnetic field strength of an external magnetic field which is applied to the magnetization-free layer after the saturation, an external magnetic field being applied to the magnetization-free layer, the external magnetic field being oriented in the same direction as the direction in which the magnetization of the magnetization-free layer is saturated in the saturation.

* * * * *